United States Patent [19]

Voorman

[11] 3,813,607

[45] May 28, 1974

[54] CURRENT AMPLIFIER

[75] Inventor: Johannes Otto Voorman, Emmasingel, Eindhoven, Netherlands

[73] Assignee: U.S. Phillips Corporation, New York, N.Y.

[22] Filed: Oct. 18, 1972

[21] Appl. No.: 298,760

[30] Foreign Application Priority Data

Oct. 21, 1971 Netherlands ...................... 7114470

[52] U.S. Cl. .................................... 330/17, 330/19

[51] Int. Cl. ............................................. H03f 3/18

[58] Field of Search ...................... 330/17, 19, 38 M

[56] References Cited

UNITED STATES PATENTS 3,614,645 10/1971 Wheatly, Jr. ...................... 330/19 X

*Primary Examiner*—Herman Karl Saalbach

*Assistant Examiner*—Lawrence J. Dahl

*Attorney, Agent, or Firm*—Frank R. Trifari

[57] ABSTRACT

Circuit arrangement providing a constant current amplification which is determined by the ratio between the emitter surface areas of a first and a second transistor of one conductivity type, the first transistor passing the input current and the second transistor passing the output current. The base currents for these transistors are supplied by a third transistor of the other conductivity type the base of which is connected to the collector of a fourth transistor of the one conductivity type in common emitter connection the base of which is connected to the input. This method of driving ensures a high degree of accuracy and also permits the use of a small supply voltage. The circuit may be used to particular advantage in a current stabilizer.

9 Claims, 5 Drawing Figures

CURRENT AMPLIFIER

The invention relates to a circuit arrangement having a constant current amplification and is particularly suitable for use in a current stabilizer circuit and comprises an input current circuit which includes the main current path of a first transistor of one conductivity type and an output current circuit which includes the main current path of a second transistor of the one conductivity type, the control electrodes of the first and second transistors being interconnected, whilst the currents required for the control electrodes of these transistors are supplied by a third transistor.

Such a circuit arrangement is described, for example, in "International Solid-State Circuits Conference," Feb. 1970, page 156. For example, FIG. 1 shows a current amplifier which is included in an operational amplifier and in which the base emitter paths of the first and second transistors are connected in parallel so that the ensuing current amplification, i.e., the ratio between the output current at the output terminal and the input current at the input terminal, is completely determined by the ratio between the emitter areas of the two transistors.

The base currents required for these two transistors are supplied by the third transistor which is of the same conductivity type and the emitter of which is connected to the bases of the first and second transistors, whilst its base is connected to the input terminal of the current amplifier. In the circuit shown the collector of this third transistor is connected to a point of constant potential.

This structure of the current amplifier ensures that the deviation from the desired current amplification due to the base currents of the first and second transistors is very small, for the influence of these base currents on the current flowing through the input current circuit is reduced owing to the current amplification factor between the base and the emitter of the third transistor. If this current amplification factor is large, the base current for the third transistor derived from the input terminal will be very small with respect to this input current, so that the current amplification is determined, with a high degree of accuracy, by the ratio between the emitter areas of the first and second transistors.

The required supply voltage is about twice the base emitter voltage of each of the transistors, because there is connected between the input terminal and the emitters of the first and second transistors the series combination of two base emitter paths, namely the base emitter path of the third transistor and the parallel connected base emitter paths of the first and second transistors.

It is an object of the present invention to provide a circuit arrangement of the type described at the beginning of this specification which also enables an accurately determined current amplification to be realized but which may be operated with a supply voltage which is considerably smaller than that used in the known circuit arrangement.

The circuit arrangement according to the invention is characterized in that the third transistor is of the complementary conductivity type and at its control electrode receives a control signal from the output electrode of a fourth transistor in common main electrode connection of the one conductivity type the control electrode of which is connected to the input current circuit.

If, for example, the base emitter paths of the first and the second transistors are connected in parallel again, there is again obtained a current amplifier the amplification of which is determined by the ratio between the emitter areas of these transistors. The influence of the base currents of these transistors on the input current is small again, because the influence of these base currents is reduced not only owing to the current amplification factor of the third transistor but also owing to the current amplification factor of the fourth transistor. The circuit arrangement according to the invention, however, may be operated with a smaller supply voltage than the known circuit arrangements, namely with the sum of the one base emitter voltage and one collector emitter knee voltage, i.e., about 0.9 volts, which is less than the terminal voltage of a single voltage cell.

It should be noted that a current amplifier adapted to be operated with an even smaller supply voltage is known. However, in this current amplifier the required base currents for the first and second transistors are obtained by short-circuiting the collector base path of the first transistor, with the result that the required base currents of the transistors without attenuation disturb the desired ratio between the input and output currents. When transistors having large current amplification factors are used, this disturbance of the desired current ratio will be comparatively small. If, however, lateral *npn* transistors are used, the disturbance becomes considerable, because these transistors have small current amplification factors, in particular in the case of small currents.

If lateral *npn* transistors are used, in addition to the advantage of a small supply voltage, a further advantage of the circuit arrangement according to the invention compared with the known circuit mentioned at the beginning of this specification occurs. As has already been mentioned, these lateral *pnp* transistors have small current amplification factors, so that in the known circuit arrangement the deviation from the desired ratio between the input and output currents due to the base currents will bd considerable, because in this circuit arrangement all the transistors are of this *pnp* type. In the circuit arrangement according to the invention, however, in this case the third transistor is of the *npn* type and hence has a large current amplification factor, so that the deviation from the desired current amplification may be considerably smaller than in the known circuit arrangement.

The circuit arrangement according to the invention has the further advantage that very large input signals can be handled by including a current source in the collector lead of the fourth transistor.

The circuit arrangement according to the invention is particularly useful in realizing a current stabilizer. In such a stabilizer two intercoupled current amplifiers are used, enabling at least one current to be obtained the value of which is accurately determined and is substantially independent of supply voltage variations. Proper use of the circuit arrangement according to the invention enables an accurate current stabilizer to be realized which is capable of controlling a large number of current sources and requires only a small supply voltage and in which the starting problems inherent in these current stabilizers are largely eliminated.

Embodiments of the invention will now be described, by way of example, with reference to the accompanying diagrammatic drawings, in which.

Figure 1:
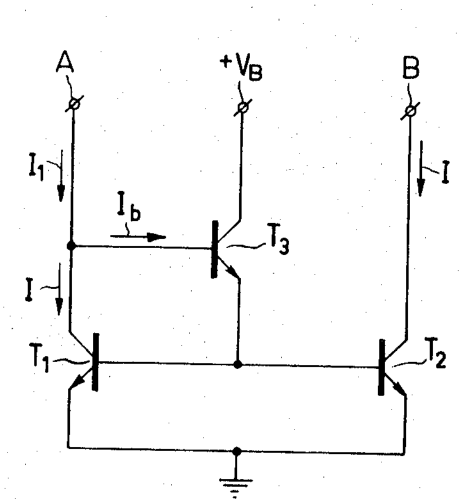
FIG. 1 is a diagram of the known current amplification circuit.

FIG. 1 shows the known current amplifier circuit which includes two *npn* transistors $T_1$ and $T_2$ the base emitter paths of which are connected in parallel. The collector of the transistor $T_1$ is connected to an input terminal A to which an input current is supplied. The collector of the transistor $T_2$ is connected to an output terminal from which the output current is derived. For driving these two transistors $T_1$ and $T_2$ a transistor $T_3$ of the *npn* type is provided the emitter of which is connected to the bases of the transistors $T_1$ and $T_2$, the base of which is connected to the input terminal A and the collector of which is connected to a point of constant potential, for example to the positive terminal $+V_B$ of the voltage supply source.

The current amplification of the circuit, i.e., the ratio between the input and output currents, is determined by the ratio between the emitter areas of the transistors $T_1$ and $T_2$. Assuming, for example, the emitter areas of these transistors to be equal, then their emitter currents always are accurately equal. If the current amplification factors of the transistors $T_1$ and $T_2$ are equal, the collector currents of the transistors $T_1$ and $T_2$ also will be equal, for example will both be $I$. The output current at the terminal B is equal to the collector current of the transistor $T_2$, so that the equality of the input and output currents is disturbed only by the base current $I_B$ of the transistor $T_3$, i.e., input current $I_1 = I + I_b$. Assuming the three transistors to have the same current amplification factor $\beta_n$ between base and collector, the base current of the transistor $T_3$ will be:

$$I_b = 2I/\beta_n(\beta_b + 1) \quad (1)$$

This expression clearly shows that when transistors having large current amplification factors are used the deviation due to this base current is very small, so that the desired current amplification is achieved with a high degree of accuracy. The required minimum supply voltage for the current amplification shown is given by the voltage required between the input terminal A and the emitters of the transistors $T_1$ and $T_2$. As the FIGURE shows, these points are connected by the series combination of two base emitter paths, namely the base emitter path of the transistor $T_3$ and the parallel connection of the base emitter paths of the transistors $T_1$ and $T_2$, which means that a voltage is required which at least is twice the base emitter voltage of a conducting transistor. When silicon transistors are used this would mean that the supply voltage should be at least about 1.2 volts.

Figure 2:
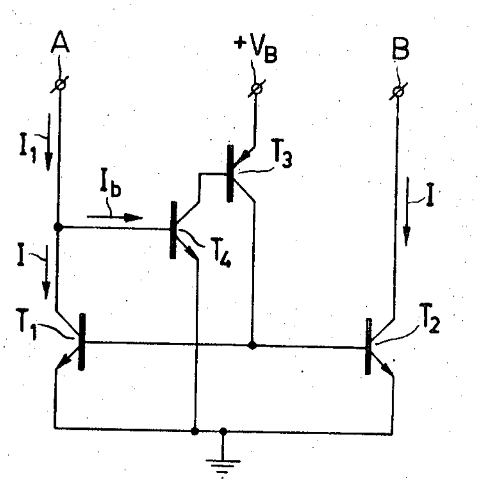
FIGS. 2, 3 and 4 are diagrams of three embodiments of the current amplifier circuit according to the invention.

FIG. 2 shows a first embodiment of the current amplifier according to the invention. The circuit again includes two transistors $T_1$ and $T_2$ of the *npn* type the base emitter paths of which are connected in parallel and the collectors of which are connected to the input terminal A and to the output terminal B respectively. However, for driving these two transistors the circuit includes two transistors, a transistor $T_3$ of the *pnp* type and a transistor $T_4$ of the *npn* type. The collector of the transistor $T_3$ is connected to the bases of the transistors $T_1$ and $T_2$, and its emitter is connected to a point of constant potential, for example to the positive terminal $+V_B$ of the supply source. Its base is connected to the collector of the transistor $T_4$ the base of which is connected to the input terminal and the emitter of which is connected, for example, to the emitters of the transistors $T_1$ and $T_2$.

Again it will readily be seen that the current amplification is determined by the ratio between the emitter areas of the transistors $T_1$ and $T_2$ and that a deviation from the desired current amplification is produced by the base current $I_b$ of the transistor $T_4$. Again assuming, for example, that the emitter areas of the transistors $T_1$ and $T_2$ are equal, their collector currents will be equal, for example will be I, and the input current will be $I_1 = I + I_b$, in complete arrangement with FIG. 1. However, $I_b$ here is:

$$I_b = 2I/\beta_p \cdot \beta_n^2 \quad (2)$$

where $\beta_n$ is the current amplification factor of the npn transistors and $\beta_p$ is the current amplification factor of the *pnp* transistor $T_3$. A comparison of the expression (2) with the expression (1) shows that the deviation due to the base current $I_b$ will be smaller by approximately a factor of $\beta_p$.

A very important advantage of the circuit shown in FIG. 2 will become apparent when the required supply voltage is considered. The voltage required between the input terminal A and the emitters of the transistors is only about 0.6 volts (silicon transistors), i.e., the base emitter voltage required for the transistor $T_4$. The voltage between the emitter of the transistor $T_3$ and the emitters of the transistors $T_1$ and $T_2$ need not exceed 0.9 volts, because the said points are connected to one another by one base emitter path and one collector emitter path only. As a result, the entire circuit may be operated with a supply voltage of about 0.9 volts, as compared to 1.2 volts in the known circuit. Obviously this is of high importance in battery-fed devices in which a minimum of cells and preferably a single cell are desired.

Figure 3:
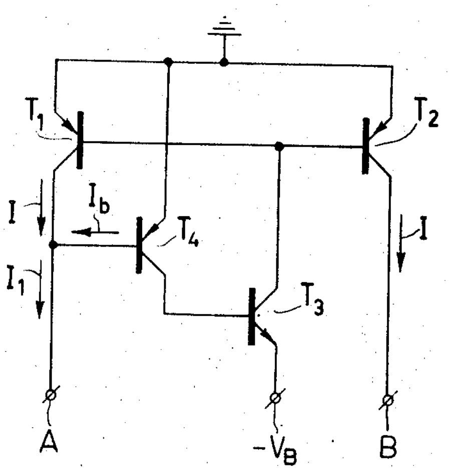

FIG. 3 shows a second embodiment the structure of which entirely corresponds to that shown in FIG. 2, with the difference that the transistors $T_1$, $T_2$ and $T_4$ here are of the *pnp* type and the transistor $T_3$ is of the *npn* type. Compared with the known circuit shown in FIG. 1, but modified to use *pnp* transistors, this circuit first has the advantage that the required supply voltage is smaller. In addition, however, the deviation from the desired current amplification used in this circuit is greatly reduced in comparison with the known circuit. When the circuit shown in FIG. 1 is made up of *pnp* transistors, the expression for the base current $I_b$ of the transistor $T_3$ corresponds to (1), however, the current amplification factor $\beta_n$ of the *npn* transistors must be replaced by the current amplification factor $\beta_p$ of the pnp transistors:

$$I_b = 2I/\beta_p(\beta_p + 1) \quad (3)$$

In an integrated circuit *pnp* transistors generally take the form of lateral transistors and hence have a comparatively low current amplification factor $\beta_p$. As a result the base current $I_b$ is comparatively large and hence the deviation from the desired current amplification due to this base current will also be comparatively large.

The base current $I_b$ of the transistor $T_4$ in the circuit shown in FIG. 3 can be expressed by $$I_b = 2I/\beta_n\ \beta_p^2 \qquad (4)$$

from which it directly follows that this base current remains very small owing to the factor $\beta_n$, the current amplification factor of the vertical *npn* transistor $T_3$, which may be very great. Thus, in addition to the advantage of a smaller supply voltage the circuit shown in FIG. 3 when compared with the known circuit provided with lateral *pnp* transistors also has the advantage that the deviation from the desired current amplification is greatly reduced. Obviously this property may be further improved by replacing the *pnp* transistor by an equivalent *pnp* transistor.

Figure 4:
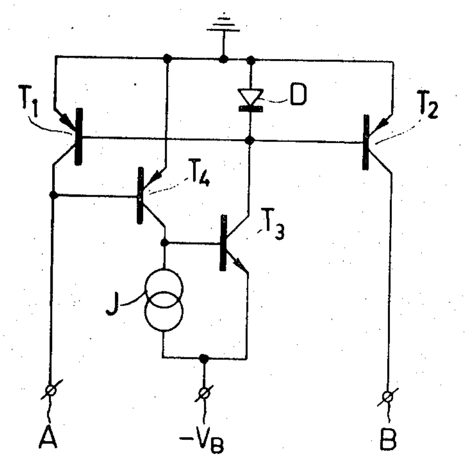

FIG. 4 shows a third embodiment, which largely corresponds to that shown in FIG. 3 but in which provisions have been made to improve the frequency behaviour. Because the transistors $T_3$ and $T_4$ of FIG. 3 carry a small direct current, their cut-off frequency will be low. A diode or a transistor connected as a diode D may be connected between the emitters and the bases of the transistors $T_1$ and $T_2$, which ensures that the transistor $T_3$ carries a larger current and hence its cut-off frequency is increased. To increase the quiescent current of the transistor $T_4$ also, a current source J may be included in its collector lead. Alternatively, the base-emitter path of the transistor $T_3$ may be shunted by a diode or a transistor connected as a diode.

However, with large input signals the use of a current source J has a particular advantage. At a large drive the currents flowing through the transistors $T_1$ to $T_4$ will become very small during the negative peak of the signal at the input. This means, however, that the impedance of these transistors become very high, so that the input impedance becomes very high. As a result the stray capacitances of the transistor $T_1$ will play an important role and cause an undesirable phase shift of the signal. This is avoided by the use of the current source J, because the transistor $T_4$ then will remain highly conducting and the input impedance will remain low, so that no undesirable phase shift if the signal occurs.

Figure 5:
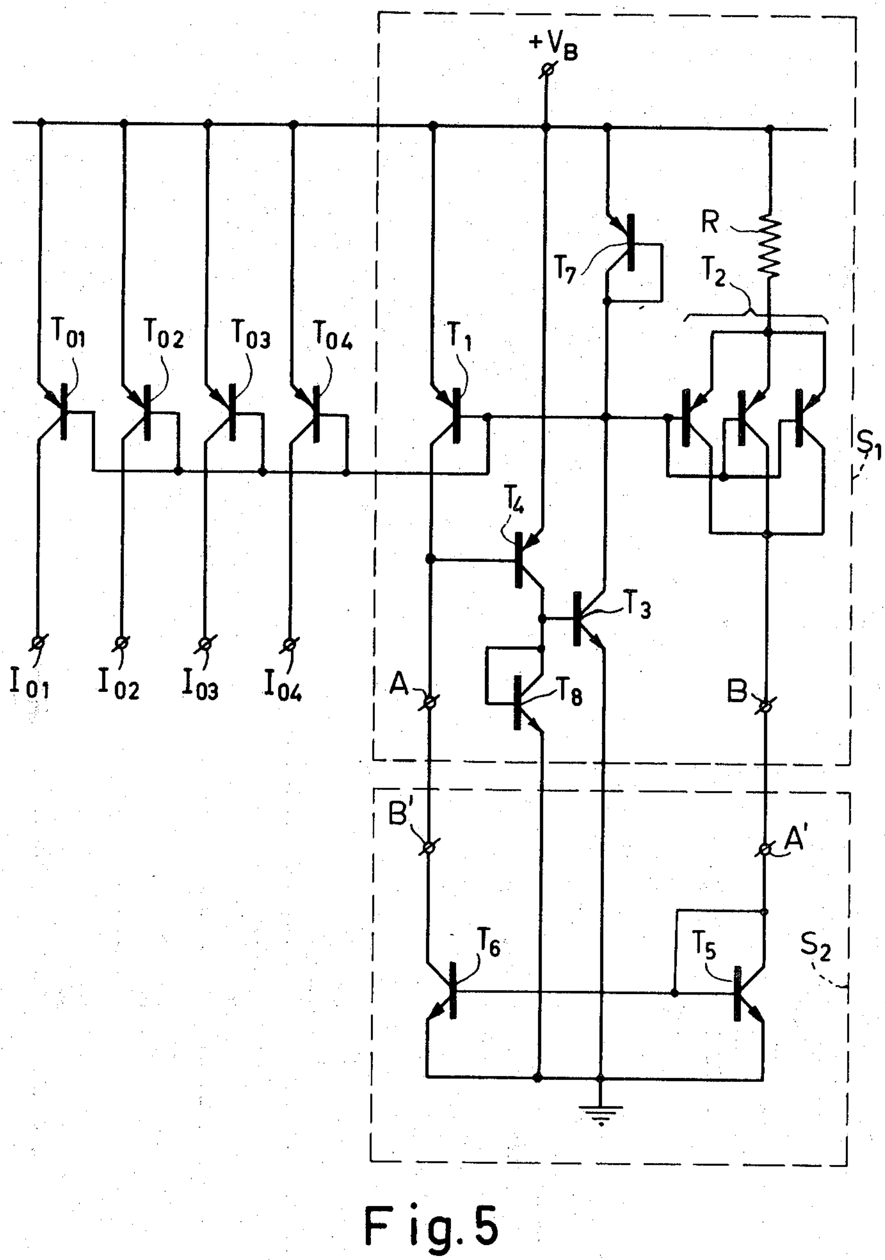
FIG. 5 shows a current stabilizer circuit in which the current amplifier circuit according to the invention is shown.

FIG. 5 shows an example of the manner in which the current amplification circuit according to the invention may be used to particularly great advantage to realize a current stabilizer circuit. The intention of such a current stabilizer is to supply currents which may serve as quiescent currents for the elements of an integrated circuit, which currents are exactly defined and are highly independent of the supply voltage. The current stabilizer shown in FIG. 5 comprises a current amplification circuit $S_1$ having an input terminal A and an output terminal B, which circuit largely corresponds to that shown in FIG. 4. However, in this circuit the emitter of the transistor $T_2$ is not directly connected to the emitter of the transistor $T_1$ but via a resistor R, whilst the transistor $T_2$ has a greater emitter area than the transistor $T_1$, which for clarity is shown by the parallel connection of three transistors. To improve the frequency behaviour of the circuit transistors $T_7$ and $T_8$ connected as diodes are included, which correspond to the diode and the current source of FIG. 4, so that the transistors $T_3$ and $T_4$ carry larger currents.

The current stabilizer further includes a second current amplifier circuit $S_2$ which comprises transistors $T_5$ and $T_6$ which have equal emitter areas and the base emitter paths of which are connected in parallel, whilst the transistor $T_5$ is connected as a diode. An input terminal A' of this second current amplifier $S_2$ is connected to the output terminal B of the first current amplifier $S_1$, and an output terminal B' of this second current amplifier is connected to the input terminal A of the first current amplifier $S_1$.

Of necessity the input and output currents of the current amplifier $S_2$ are equal and hence so are the input and output currents of the current amplifier $S_1$. Neglecting the base current of the transistor $T_4$, the collector currents, and hence to a good approximation the emitter currents also, of the transistors $T_1$ and $T_2$ will be equal. As a result, the magnitudes of these currents are completely determined, because the base emitter voltage of the transistor $T_1$ associated with this emitter current must be equal to the sum of the base emitter voltage of the transistor $T_2$ associated with this current and the voltage across the resistors R. Consequently, the magnitude of the currents are completely determined by the resistance value of the resistor R and the ratio between the emitter areas of the transistors $T_1$ and $T_2$, and are substantially independent of the supply voltage.

This current stabilizer enables a plurality of current sources to be controlled in that, for example, the base emitter paths of transistors $T_{01}$ and $T_{04}$ are connected in parallel with the base emitter path of the transistor $T_1$, so that their collector currents and hence the currents at terminals $I_{01}$ to $I_{04}$ are completely determined by the current of the current stabilizer.

A first advantage of the current stabilizer shown consists in that a very small supply voltage may be used. Even an overall supply voltage of about 0.9 volts is sufficient to operate the circuit. Furthermore the accuracy of the circuit is very high, because the current deviation due to the base current of the transistor $T_4$ is small. The current stabilizer is capable of controlling a large number of current sources, because the currents required for these current sources, in the embodiment shown the base currents of the transistors $T_{01}$ to $T_{04}$, can readily be supplied by the transistor $T_3$. A further advantage of the circuit is that the starting difficulties which occur in the known current stabilizers of this type are substantially eliminated. Current stabilizers of this type in principle have a stable state in which the currents differ from zero. It has been found that in a current stabilizer provided with a current amplifier according to the invention such special provisions can be dispensed with, because when the currents are zero the loop amplification is such as to automatically bring the current stabilizer in the desired stable state.

It will be clear that the current stabilizer shown in FIG. 5 may be modified in many respects. For example, the current amplifier $S_2$ may be replaced by another known current amplifier. It may also be a current amplifier according to the invention. The resistor need not be included in the current amplifier $S_1$ but may alternatively be included in the current amplifier $S_2$, in which case the emitter area of the associated transistor must be correspondingly changed. The input and output currents of the current amplifier circuit need not be equal. Altogether many modifications are possible which, however, have the common feature that at least one of the current amplifier is provided with a control of the transistors having parallel connected base emitter paths as described with reference to FIGS. 2 to 5.

It will further be appreciated that, although the circuit has been described with reference to embodiments using bipolar transistors, unipolar transistors may also be used.

What is claimed is:

1. A current amplifier comprising:

an input terminal;

a first transistor of one conductivity type, having a collector connected to said input terminal and having a base and an emitter;

an output terminal;

a second transistor of said one conductivity type, having a collector connected to said output terminal, having a base connected to said first transistor base, and having an emitter connected to said first transistor emitter;

a third transistor of conductivity type opposite to said first conductivity type, having a collector connected to said connected bases of said first and second transistors, and having a base and an emitter;

a fourth transistor of said one conductivity type, having a collector connected to said third transistor base, having a base connected to said input terminal, and having an emitter connected to said first transistor emitter; and means for connecting a supply voltage source between said third transistor emitter and said first transistor emitter.

2. A current amplifier as defined in claim 1 and further comprising means for increasing the bias currents in said third and fourth transistors to thereby improve the frequency response of said current amplifier.

3. A current amplifier as defined in claim 2 wherein said means for increasing the bias current of said third transistor comprises a diode of said one conductivity type having a collector connected to said first transistor base, and having an emitter connected to said first transistor emitter.

4. A current amplifier as defined in claim 2 wherein said means for increasing the bias current of said fourth transistor comprises a diode of said opposite conductivity type having a collector connected to said third transistor base, and having an emitter connected to said third transistor emitter.

5. A current amplifier as defined in claim 2 wherein said means for increasing the bias current of said fourth transistor comprises a current source connected between said fourth transistor collector and said third transistor emitter.

6. A current amplifier as defined in claim 1 wherein said first, second and fourth transistors are lateral *pnp* transistors and said third transistor is a vertical *npn* transistor.

7. A current stabilizer comprising a current amplifier as defined in claim 1 wherein said second transistor has a larger emitter area than said first transistor and said second transistor emitter is connected to said first transistor emitter through a resistance to thereby establish an emitter current ratio therebetween, and further comprising:

a fifth transistor of said opposite conductivity type, having a collector and a base connected to said output terminal, and having an emitter connected to said third transistor emitter;

a sixth transistor of said opposite conductivity type, having a collector connected to said input terminal, having an emitter connected to said third transistor emitter, and having a base connected to said fifth transistor base; and output means electrically connected to said first transistor base.

8. A current stabilizer as defined in claim 6 and further comprising means for increasing the bias currents in said third and fourth transistors to thereby improve the frequency response of said current stabilizer.

9. A current stabilizer as defined in claim 8 wherein said first, second and fourth transistors are lateral pnp transistors and said third, fifth and sixth transistors are vertical *npn* transistors.

* * * * *